United States Patent
Cheng et al.

(10) Patent No.: US 8,062,487 B2
(45) Date of Patent: Nov. 22, 2011

(54) WAFER SUPPORTING DEVICE OF A SPUTTERING APPARATUS

(75) Inventors: Chi-Piao Cheng, Taipei County (TW); Li-Chun Liang, Taipei (TW); Yu-Jen Huang, Chia-I (TW); Been Chen, Hsinchu County (TW); Sheng-Yih Ting, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 705 days.

(21) Appl. No.: 11/768,192

(22) Filed: Jun. 25, 2007

(65) Prior Publication Data

US 2008/0317564 A1 Dec. 25, 2008

(51) Int. Cl.
*C25B 9/00* (2006.01)
*C25B 11/00* (2006.01)
*C25B 13/00* (2006.01)
*C23C 14/00* (2006.01)
*C23C 16/00* (2006.01)
*C23C 16/50* (2006.01)

(52) U.S. Cl. ............ 204/298.15; 204/298.11; 118/721; 118/723 R; 118/728; 118/729

(58) Field of Classification Search .................. 118/729, 118/723 R, 728, 721; 204/298.11, 298.15; 427/248.1; 438/678
See application file for complete search history.

(56) References Cited

U.S. PATENT DOCUMENTS

| | | | | |
|---|---|---|---|---|
| 5,589,224 A * | 12/1996 | Tepman et al. | ............ | 427/248.1 |
| 5,632,873 A * | 5/1997 | Stevens et al. | ........... | 204/298.15 |
| 5,803,977 A * | 9/1998 | Tepman et al. | ............... | 118/728 |
| 5,951,775 A * | 9/1999 | Tepman | ....................... | 118/729 |
| 6,051,122 A * | 4/2000 | Flanigan | .................. | 204/298.11 |
| 6,171,453 B1 * | 1/2001 | Chung et al. | ............. | 204/192.12 |
| 6,423,636 B1 * | 7/2002 | Dordi et al. | .................... | 438/678 |
| 7,026,009 B2 * | 4/2006 | Lin et al. | ............................ | 427/8 |
| 7,520,969 B2 * | 4/2009 | Miller | ...................... | 204/298.11 |
| 2008/0141942 A1 * | 6/2008 | Brown et al. | ............. | 118/723 R |

FOREIGN PATENT DOCUMENTS

JP 2004200620 A * 7/2004
* cited by examiner

*Primary Examiner* — Keith Hendricks
*Assistant Examiner* — Michael Band
(74) *Attorney, Agent, or Firm* — Winston Hsu; Scott Margo

(57) ABSTRACT

A wafer supporting device of a sputter apparatus includes a pedestal positioned in a sputtering chamber and used to load a wafer for sputtering, a deposition ring having a recess positioned on a peripheral portion of the pedestal, and a cover ring positioned on the pedestal and the deposition ring. The cover ring has a gate corresponding to the recess.

11 Claims, 4 Drawing Sheets

WAFER SUPPORTING DEVICE OF A SPUTTERING APPARATUS

BACKGROUND OF THE INVENTION

1. Field of the Invention

The present invention relates to a wafer supporting device of a sputtering apparatus, and more particularly, to a wafer supporting device of a sputtering apparatus capable of reducing arcing.

2. Description of the Prior Art

In the ultra large scale integration (ULSI) process, elements are defined by applying complicated photolithograph methods to deposited layers. Conventional deposition comprises chemical vapor deposition (CVD) and physical vapor deposition (PVD). The PVD further comprises evaporation, sputter, etc. and is widely used in metal layer deposition. For example, in a copper damascene process, a barrier layer is deposited in a trench or via before forming a copper wire to prevent the copper wire from diffusing into a dielectric layer. To comply with requirements such as high conductivity, low resistivity, qualified electron-migration-resistance, and high temperature stability, those skilled in the art utilize tantalum (Ta) or tantalum nitride (TaN) to form the barrier layer by sputtering it in the trench or via.

Please refer to FIG. 1, which is a schematic drawing of a conventional sputtering apparatus. As shown in FIG. 1, a sputtering apparatus 10 comprises a chamber 12, a metal target 14 positioned in a top portion of the chamber 12, a shield 16, and a wafer supporting device 20 for loading a subject such as a wafer 30 in copper damascene process for sputtering and for adjusting the wafer 30 to a proper position. The sputtering apparatus 10 also comprises a wafer lifter 18 for transporting the wafer 30 between the wafer supporting device 20 and a robot arm.

Please refer to FIG. 2, which is a schematic drawing of the wafer supporting device 20 of the sputtering apparatus 10 shown in FIG. 1. As shown in FIG. 2, the wafer supporting device 20 comprises a pedestal such as an electrostatic chuck (E-chuck) 22 for attracting the wafer 30 with a direct current voltage, a deposition ring 24 of ceramic material, and a cover ring 28 of metal material. The deposition ring 24 further comprising an aluminum or aluminum oxide coating. As shown in FIG. 2, the deposition ring 24 covers at least a portion of an upper surface of the E-chuck 22 for reducing exposure of the E-chuck 22 to the plasma and for preventing the E-chuck 22 from deposition of sputtered material. The cover ring 28 encircles at least a portion of the deposition ring 24 to reduce deposition of sputtered materials on both of the deposition ring 24 and the underlying E-chuck 22.

Please refer to FIG. 2 again, because sputtered metal material often deposits on the deposition ring 24, especially in a portion near the cover ring 28 as the circle 40 shown in FIG. 2, a potential difference between the deposition ring 24 and the cover ring 28 results and an arcing which attracts metal ion more easily is caused. Thus, thickness of a deposited metal film is influenced and contamination of the devices is found.

Please refer to FIG. 3, which is a schematic drawing illustrating a barrier layer sputtering result on the wafer 30. When the wafer 30 undergoes a bias sputtering process, a negative bias voltage is applied to the wafer 30 for attracting positive ions to attack a surface of the wafer 30. The attack causes a momentum transfer and makes the deposited molecules rearranged. In addition, the negative bias voltage can be increased to cause an ion bombardment in a re-sputtering method. For example, when the barrier layer 34 is deposited in a via or trench 32, the negative bias voltage is increased and the ion bombardment is caused to take off the metal material undesiredly deposited on an opening of the via trench 32 as circle 36 shown in FIG. 3. Therefore uniformity of the barrier layer 34 is improved. Please note that arcing happened in between the deposition ring 24 and the cover ring 28 not only influences thickness of the barrier layer 34 by reducing the negative bias voltage, but also influences the re-sputtering result and the uniformity of the barrier layer 34 by reducing efficiency of the ion bombardment.

SUMMARY OF THE INVENTION

Therefore the present invention provides a wafer supporting device of a sputtering apparatus for preventing arcing and improving sputtering results.

According to the present invention, a wafer supporting device of a sputter apparatus is provided. The wafer supporting device comprises a pedestal positioned in a sputter chamber for loading a wafer for sputtering, a deposition ring positioned on a peripheral portion of the pedestal, and a cover ring positioned on the pedestal. The deposition ring comprises a recess and the cover ring comprises a gate corresponding to the recess of the deposition ring.

According to the wafer supporting device provided by the present invention, the gate of the cover ring and the recess of the deposition ring are engaged without contacting, therefore the sputtered material is prevented from being deposited on the deposition ring near the cover ring, and thus arcing between the deposition ring and the cover ring is prevented. Since arcing between the deposition ring and the cover ring is prevented, thickness and uniformity of the deposited film is also improved and contamination to the devices is reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
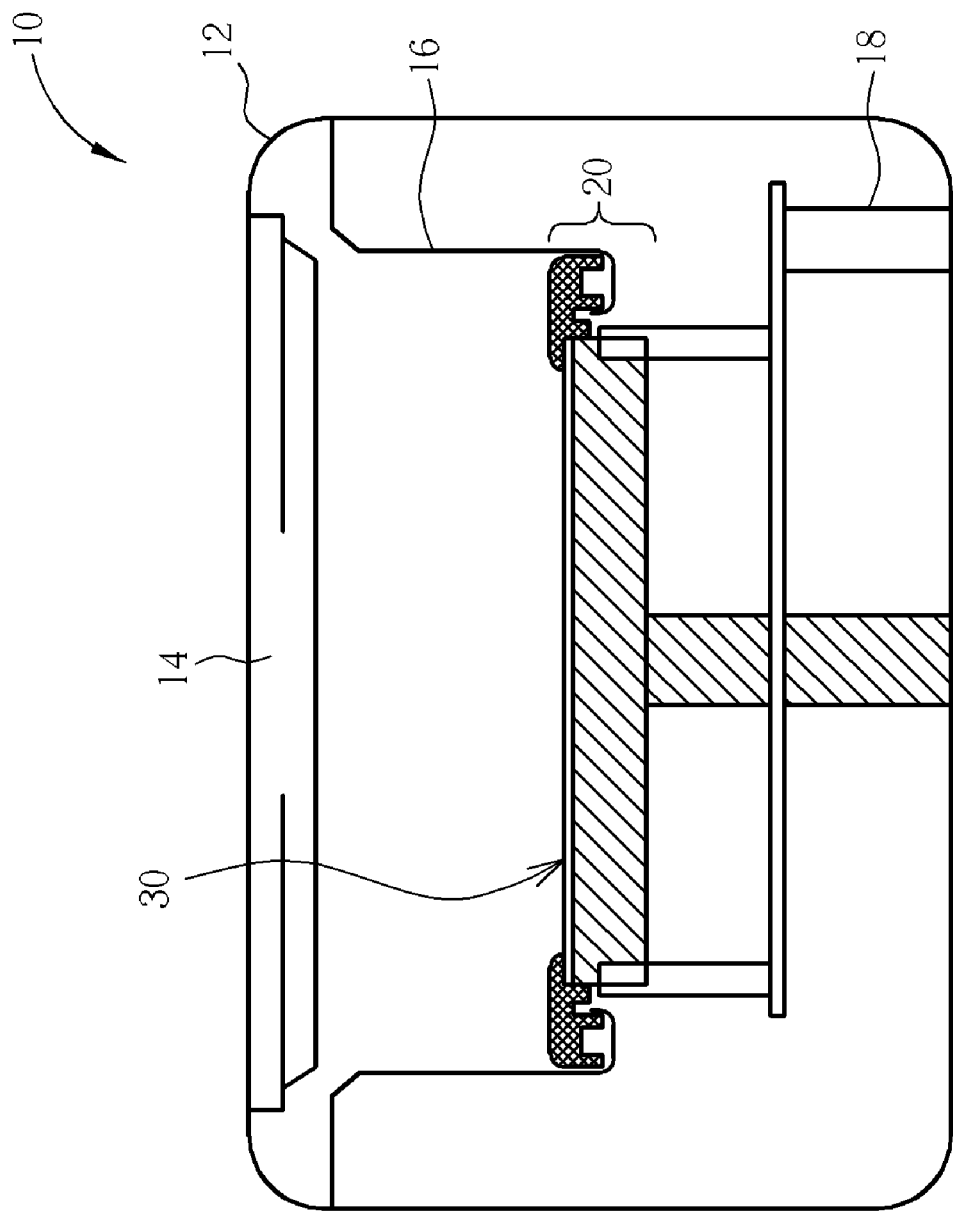
FIG. 1 is a schematic drawing of a conventional sputtering apparatus.
Figure 2:
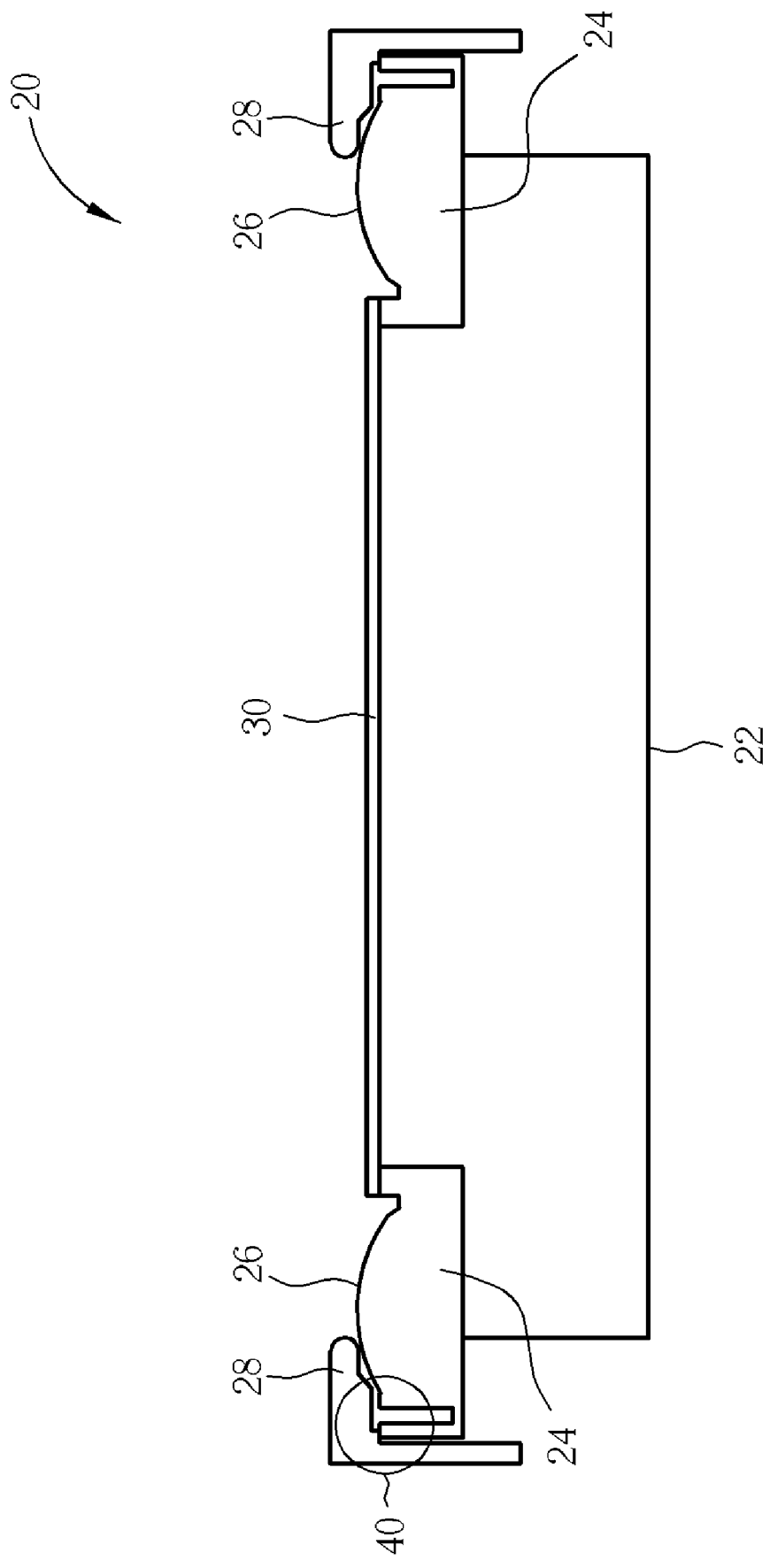
FIG. 2 is a schematic drawing of the wafer supporting device of the sputtering apparatus shown in FIG. 1.
Figure 3:
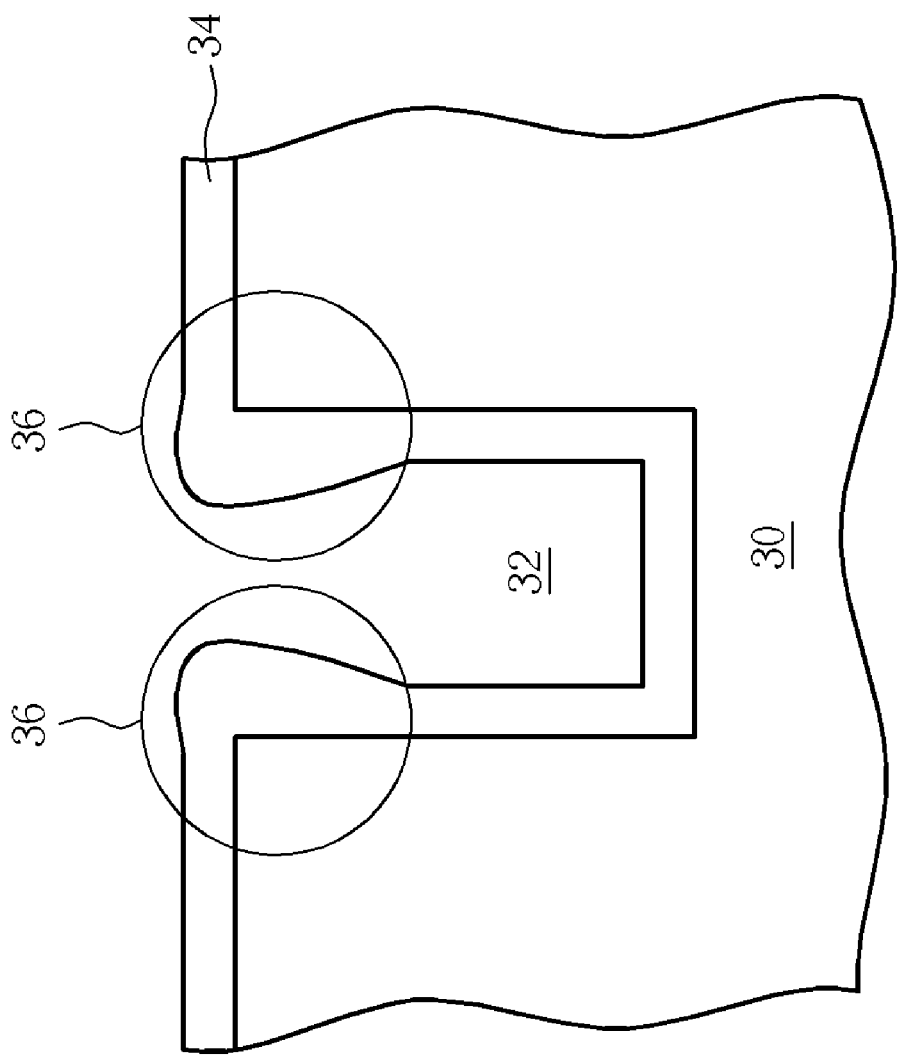
FIG. 3 is a schematic drawing illustrating a barrier layer sputtering result.
Figure 4:
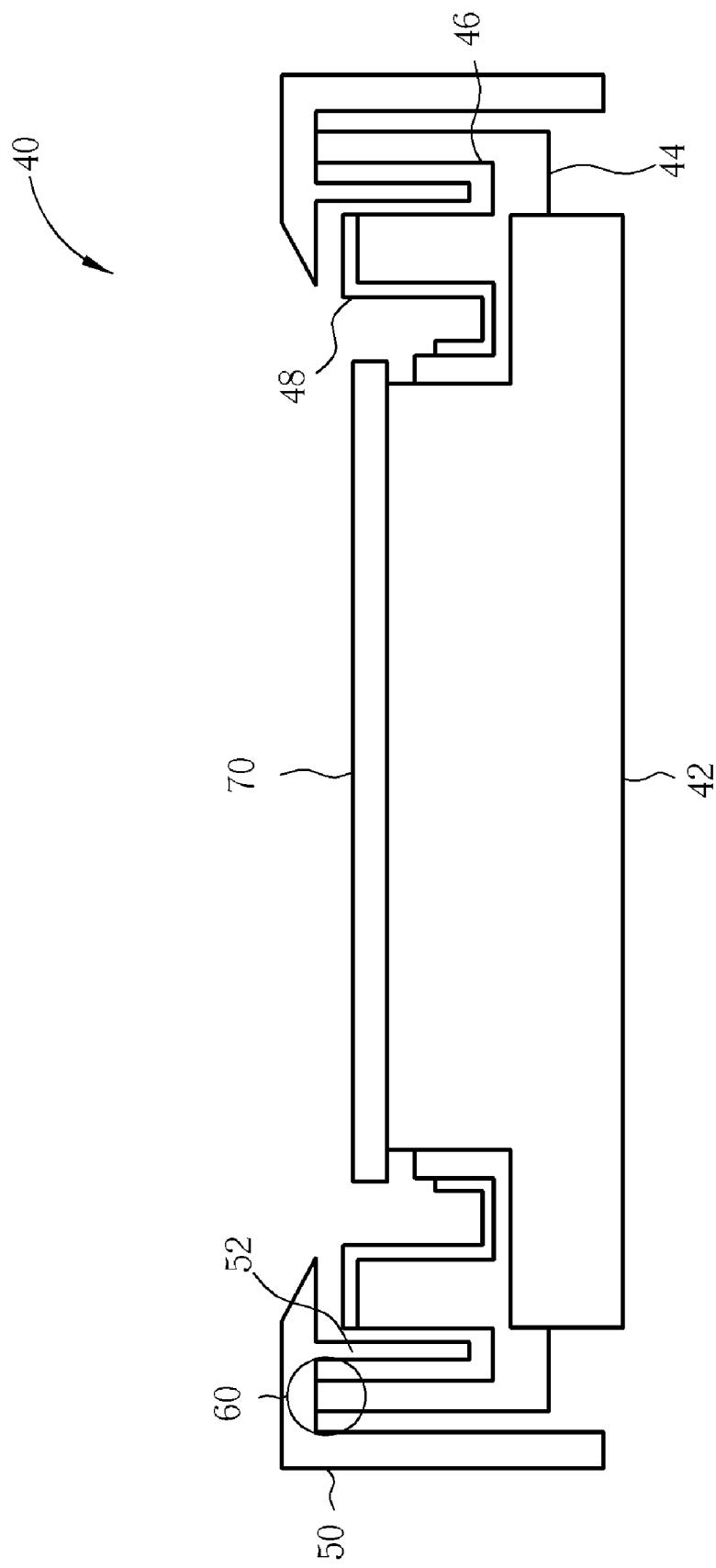
FIG. 4 is a schematic drawing of the wafer supporting device of a sputtering apparatus provided by a preferred embodiment.

Please refer to FIG. 4, which is a schematic drawing of the wafer supporting device of a sputtering apparatus provided by a preferred embodiment of the present invention. As shown in FIG. 4, a wafer supporting device 40 provided by the invention comprises a pedestal 42 positioned in a chamber as shown in FIG. 1. The wafer supporting device 40 is used to load a subject such as a wafer 70 for sputtering. The pedestal 42 comprises an electrostatic chuck (E-chuck) for attracting the wafer 70. Additionally, the pedestal 42 comprises ceramic material.

As shown in FIG. 4, the wafer supporting device 40 further comprises a deposition ring 44 and a cover ring 50. The deposition ring 44 is positioned on the pedestal 42 and covers a peripheral portion of the pedestal 42 for reducing exposure of the pedestal 42 to the plasma and for preventing the pedestal 42 from deposition of sputtered material. The deposition ring 44 comprises ceramic material and is removable. The deposition ring 44 further comprises a recess 46 and a metal film 48, such as an aluminum or aluminum oxide coated on a portion of an upper surface of the deposition ring 44. Additionally, the metal film 48 coated on portion of the deposition ring 44 does not cover the recess 46. The metal film 48 is used to increase surface roughness and cause interlocking effect. Thus, effective area of bonding is increased and adhesion of the sputtered film is improved.

Please refer to FIG. 4 again. The cover ring 50 of the wafer supporting device 40 is positioned on the pedestal 42 in a removable manner. The cover ring comprises metal material. The cover ring 50 further comprises a gate 52 corresponding to the recess 46 of the deposition ring 44. Please note that the cover ring 50 and the gate 52 are monolithically formed. Furthermore, the gate 52 has a height of 3-5 mm. It is noteworthy that the gate 52 of the cover ring 50 and the recess 46 of the deposition ring 44 are engaged without contacting during a sputtering process.

Please still refer to FIG. 4. In a sputtering practice, sputtered metal material will deposit on the deposition ring 44 and the recess 46, but not on the recess 46 behind the gate 52. Since the gate 52 obstructs the sputtered metal material, it will not be found in conjunction of the deposition ring 44 and the cover ring 50, as shown in circle 60. In other words, because of the installation of the gate 52, arcing between the deposition ring 44 and the cover ring 50 is effectively prevented.

As mentioned above, arcing, which easily attracts metal ions, will influence thickness of the deposited film and cause contamination to the devices. And when arcing occurs in a bias sputtering process, it not only reduces the negative bias voltage which influences thickness of the deposited film, but also reduces efficiency of the ion bombardment which influences uniformity of the deposited film. However, since the gate 50 obstructs the sputtered material from the conjunction of the deposition ring 44 and the cover ring 50, arcing and its adverse influences as mentioned above are prevented. Therefore the thickness and the uniformity of the deposited film are effectively improved. When depositing a film with high uniformity requirement such as Ta or TaN film used as a barrier layer, the wafer supporting device 40 provided by the present invention can improve the sputtering result effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer supporting device of a sputter apparatus comprising:
    a pedestal positioned in a sputter chamber for loading a wafer for sputtering;
    a deposition ring positioned on a peripheral portion of the pedestal, the deposition ring comprising a recess having a closed bottom portion and a metal film covering a portion of an upper surface of the deposition ring, the metal film not covering the recess; and
    a cover ring positioned on the pedestal and the deposition ring, the cover ring comprising a gate corresponding to the recess of the deposition ring, the gate not touching the bottom portion of the recess, the gate being positioned between the deposition ring and a conjunction of the deposition ring and the cover ring and the metal film.

2. The wafer supporting device of claim 1, wherein the pedestal comprises an electrostatic chuck (E-chuck) for attracting the wafer.

3. The wafer supporting device of claim 2, wherein the E-chuck comprises ceramic.

4. The wafer supporting device of claim 1, wherein the deposition ring comprises ceramic.

5. The wafer supporting device of claim 1, wherein the metal film comprises aluminum or aluminum oxide.

6. The wafer supporting device of claim 1, wherein the cover ring is removable.

7. The wafer supporting device of claim 1, wherein the cover ring comprises metal material.

8. The wafer supporting device of claim 1, wherein the cover ring and the gate are monolithically formed.

9. The wafer supporting device of claim 1, wherein the gate has a height of 3-5 mm.

10. The wafer supporting device of claim 1, wherein the gate of the cover ring and the recess of the deposition ring are engaged without contacting.

11. A wafer supporting device of a sputter apparatus comprising:
    a pedestal positioned in a sputter chamber for loading a wafer for sputtering;
    a deposition ring positioned on a peripheral portion of the pedestal, the deposition ring comprising a recess and the recess of the deposition ring having a closed bottom portion;
    a metal film covering a portion of an upper surface of the deposition ring, the metal film not covering the recess; and
    a cover ring positioned on the pedestal and the deposition ring and not contacted to the wafer, the cover ring comprising a gate corresponding to the recess of the deposition ring, the gate not touching the bottom portion of the recess and positioned between the deposition ring and a conjunction of the deposition ring and the cover ring.

* * * * *